(12) United States Patent
Frohberg et al.

(10) Patent No.: US 7,741,191 B2
(45) Date of Patent: Jun. 22, 2010

(54) METHOD FOR PREVENTING THE FORMATION OF ELECTRICAL SHORTS VIA CONTACT ILD VOIDS

(75) Inventors: Kai Frohberg, Niederau (DE); Sven Mueller, Wiednitz (DE); Frank Feustel, Dresden (DE)

(73) Assignee: GlobalFoundries Inc., Austin, TX (US)

( * ) Notice: Subject to any disclaimer, the term of this patent is extended or adjusted under 35 U.S.C. 154(b) by 328 days.

(21) Appl. No.: 11/951,092

(22) Filed: Dec. 5, 2007

(65) Prior Publication Data
US 2008/0265365 A1 Oct. 30, 2008

(30) Foreign Application Priority Data
Apr. 30, 2007 (DE) .................. 10 2007 020 268

(51) Int. Cl.
*H01L 21/76* (2006.01)
(52) U.S. Cl. .............. 438/421; 438/422; 257/E21.319
(58) Field of Classification Search .............. 438/421, 438/422; 257/E21.319
See application file for complete search history.

(56) References Cited
U.S. PATENT DOCUMENTS

| 4,945,070 A | 7/1990 | Hsu | 437/160 |
|---|---|---|---|
| 5,789,314 A | 8/1998 | Yen et al. | 438/622 |
| 6,740,549 B1 | 5/2004 | Chen et al. | 438/197 |
| 2002/0001936 A1 | 1/2002 | Terauchi et al. | 438/618 |
| 2002/0014679 A1 | 2/2002 | Lee et al. | 257/522 |
| 2002/0036349 A1 | 3/2002 | Saito et al. | 257/758 |
| 2004/0094821 A1* | 5/2004 | Lur et al. | 257/522 |

FOREIGN PATENT DOCUMENTS

GB    EP 0 736 896 A2    10/1996

OTHER PUBLICATIONS

Foreign associate transmittal letter dated Jan. 24, 2008.
Translation of Official Communication issued Dec. 18, 2007.

* cited by examiner

*Primary Examiner*—Jerome Jackson, Jr.
*Assistant Examiner*—Paul A Budd
(74) *Attorney, Agent, or Firm*—Williams, Morgan & Amerson

(57) ABSTRACT

Densely spaced gates of field effect transistors usually lead to voids in a contact interlayer dielectric. If such a void is opened by a contact via and filled with conductive material, an electrical short between neighboring contact regions of neighboring transistors may occur. By forming a recess between two neighboring contact regions, the void forms at a lower level. Thus, opening of the void by contact vias is prevented.

12 Claims, 8 Drawing Sheets

METHOD FOR PREVENTING THE FORMATION OF ELECTRICAL SHORTS VIA CONTACT ILD VOIDS

BACKGROUND OF THE INVENTION

1. Field of the Invention

The present disclosure relates to the field of semiconductor manufacturing, and, more particularly, to the formation of a semiconductor device which has a reduced tendency to generate electrical shorts through contact ILD voids.

2. Description of the Related Art

Modern integrated circuits comprise a large number of circuit elements, such as resistors, capacitors, transistors and the like. Typically, these circuit elements are formed on and in a semiconductor layer, such as a silicon layer, wherein it is usually necessary to substantially electrically isolate adjacent semiconductor regions from each other in which the individual circuit elements are formed. A representative example in this respect is a field effect transistor, the active area of which, i.e., the highly doped drain and source regions with an inversely lightly doped channel region disposed therebetween, is defined by an isolation structure formed in the semiconductor material.

Since the critical feature sizes of the circuit elements, such as the gate length of field effect transistors, are steadily decreasing, the area enclosed by the isolation structures, as well as the isolation structures themselves, is also reduced in size. Among the various techniques for forming the isolation structures, the so-called shallow trench isolation (STI) technique has proven to be the most reliable method and has become the most frequently used technique for forming isolation structures for sophisticated integrated circuits.

According to the STI technique, individual circuit elements are insulated from each other by shallow trenches etched into the semiconductor material. This semiconductor material may be a semiconductor substrate, when bulk semiconductor devices are considered. Alternatively, a semiconductor layer may be formed on an insulating substrate, as is the case, for example, for silicon-on-insulator (SOI) substrates, in which the circuit elements are formed. The trenches are subsequently filled with a dielectric material, such as an oxide, to provide the required electrical insulation of adjacent circuit elements.

On the other hand, the circuit elements need to be electrically contacted. A typical example of such an electrical contact in the fabrication of semiconductor devices is the formation of contact plugs, wherein openings extending through an interlayer dielectric (ILD) are filled with a conductive material in order to electrically connect to the respective circuit element. A bottom region and sidewall region of the opening is usually provided with an appropriate intermediate layer, that is, a conductive layer, so that subsequently deposited conductive material exhibits good adhesion to the surrounding dielectric layer, and undue interaction of the conductive material with the surrounding dielectric layer may be avoided during processing as well as during operation of the semiconductor device. In advanced semiconductor devices, the interconnect plugs are typically formed of a tungsten-based metal that are provided in an interlayer in the electric stack, which is typically comprised of silicon dioxide, including a bottom etch stop layer typically formed of silicon nitride.

In modern integrated circuits, openings (so-called vias) are formed exhibiting an aspect ratio that may be as high as approximately 8:1 or more, and the opening may have a diameter of 0.1 μm or smaller. Further, the high integration and the close packing of circuit elements, in particular the close packing of field effect transistors, also leads to a high aspect ratio between the gate electrodes of neighboring transistors. The etch stop layer formed above the circuit elements increases the aspect ratio even further. Therefore, in highly integrated circuits, the ILD deposition is not able to fill the originated gap between neighboring circuit elements, for example, between neighboring gate electrodes of field effect transistors, and thus causes a void along adjacent gates.

With reference to FIGS. 1A-1D, a typical conventional process for manufacturing contacts to neighboring circuit elements in accordance with a well-established tungsten technology will now be described in more detail in order to illustrate the problems involved in the formation of a reliable and high yield semiconductor device.

FIG. 1A schematically shows a semiconductor device 100 during a manufacturing stage for the formation of a contact interlayer dielectric above two neighboring circuit elements, such as transistors 110 formed above an appropriate semiconductor substrate 101. Each circuit element 110 may comprise one or more contact regions, such as a contact region of a gate electrode 111, and of drain and source regions 112. The contact regions may comprise a silicide portion 111A, 112A which provides a good and reliable electrical contact. The circuit elements 110 are covered by a dielectric material which may comprise a contact etch stop layer 102, which may be formed of silicon nitride. The circuit elements 110 are electrically isolated by a shallow trench isolation 114. The shallow trench isolation 114 may be slightly recessed with respect to the contact regions 112A of the source and drain regions 112. Although, in an initial manufacturing stage, the shallow trench isolation is planarized with the surface of the semiconductor layer 101, the slight recessing of the STI may occur due to material removal from the STI during manufacturing of the circuit elements 110, e.g., by etch or cleaning processes.

In highly integrated circuits, as shown in FIG. 1A, the small distance between the gate electrodes 111 of the circuit elements 110 leads to a high aspect ratio of the gap 116 between the gate electrodes 111. The etch stop layer 102, as well as the slight recess of the shallow trench isolation 114, further enhances this high aspect ratio.

FIG. 1B shows the semiconductor device 100 of FIG. 1A in a further advanced manufacturing stage, wherein silicon dioxide 103 is deposited on the etch stop layer 102 on the basis of well-known techniques, e.g., plasma enhanced chemical vapor deposition (PECVD) techniques, e.g., on the basis of TEOS (tetraethylorthosilicate, $Si(OC_2H_5)_4$), thereby providing a dense and compact material layer.

It was found by the inventors that, for narrow gaps 116, the deposition process of the interlayer dielectric 103 is not capable of filling these gaps 116 completely, but rather a void 118 develops as is schematically shown in FIG. 1C, which shows a further advanced manufacturing step of the semiconductor device 100. It should be noted that FIGS. 1A-1D are not drawn to scale but are exaggerated to some extent for illustration purposes.

FIG. 1D shows the semiconductor device 100 in a further advanced manufacturing stage. Herein, the formation of the interlayer dielectric layer 103 has been completed. Further, after any optional planarization processes for planarizing the layer 103, a photolitho-graphic sequence has been performed on the basis of well-established techniques, followed by anisotropic etch techniques and recipes for forming the contact openings 104 in the layer 103. The etch process for forming the contact openings 104 may be reliably controlled on the basis of the etch stop layer 102. Thereafter, a further etch process may be performed to finally open the contact etch stop layer 102 on the basis of well-established techniques. Thereafter the titanium layer, e.g., a Ti/TiN layer may be formed on the basis of ionized physical vapor deposition, such as sputter deposition 105. The term "sputtering" or "sputter deposition" describes a mechanism in which atoms are ejected from a surface of a target material upon being hit by sufficiently energetic particles. Although, in principle, the barrier layer 105 may be formed by using chemical vapor deposition (CVD) techniques, sputter deposition is widely used for the deposition of the barrier layer 105 for the following reasons.

Sputter deposition allows relatively uniform deposition of layers over large area substrates, since sputtering may be accomplished from large-area targets. Control of film thickness by sputter deposition is relatively simple as compared to CVD deposition and may be achieved by selecting a constant set of operating conditions, wherein the deposition time is adjusted to achieve the required film thickness. Moreover, the composition of compounds, such as titanium nitride used in the barrier layer 105, may be controlled more easily and precisely in sputter deposition processes as compared to CVD. Additionally, the surfaces of the substrates to be processed may be sputter cleaned prior to the actual film deposition so that any contamination of the surface may be efficiently removed and further recontamination prior to the actual deposition process may be effectively suppressed. For an efficient deposition of a moderately thin material within the contact openings 104 having a moderately high aspect ratio, so-called ionized sputter deposition techniques are used in which target atoms liberated from the target are efficiently ionized by a respective plasma ambient while moving towards the substrate. On the basis of a DC or RF bias, the directionality of the moving ionized target atoms may be significantly enhanced, thereby enabling the deposition of target material at the bottom of the contact openings 104 even for high aspect ratios.

As shown in FIG. 1D, the void 118 formed in the interlayer dielectric layer 103 is opened by two neighboring contact openings 104. The subsequent Ti/TiN barrier cannot seal the opening 120 in the contact via 104. Therefore, the following deposition of tungsten 122 fills (at least in part) the void 118 and causes an electrical short between neighboring contacts. Such an electrical short reduces the overall yield.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the present disclosure is directed to a technique that enables the formation of semiconductor devices and, in particular, the formation of contact plugs in semiconductor devices which directly connect to circuit elements, such as transistors, while significantly reducing the formation of shorts due to opened voids in the contact ILD by forming a recess between the respective neighboring circuit elements. Consequently, compared to conventional techniques which purposely do not form a recess between two neighboring circuit elements, but rather try to avoid the recess formation due to removal of material of the isolation trench, by employing the principles disclosed herein, a significantly reduced formation of electrical shorts may be achieved, even for highly scaled semiconductor devices. The novel technique therefore provides potential for forming extremely high integration and extremely low distances between neighboring gates while providing reliable semiconductor devices and a high yield.

One illustrative method involves providing a semiconductor device having at least two circuit elements which have contact regions. The method further comprises forming a recess between two neighboring circuit elements, wherein the recess has a predetermined depth with respect to a contact region of the circuit elements such that, in a subsequently formed interlayer dielectric, a void is formed spaced from via paths along which contact vias are formed for contacting the contact regions of the circuit elements through the interlayer dielectric.

Another illustrative method involves selectively etching a trench isolation which is located between two circuit elements such that, in a subsequently formed interlayer dielectric, a void is formed spaced from via paths along which contact vias are formed for contacting contact regions of the circuit elements through the interlayer dielectric material.

An illustrative semiconductor device is disclosed that comprises two circuit elements having contact regions. A trench isolation is formed between the circuit elements and an interlayer dielectric is formed above the circuit elements. The interlayer dielectric comprises contact vias and a void, wherein the contact vias contact the contact regions of the device elements. Further, the trench isolation is recessed with respect to the contact regions such that the void formed in the interlayer dielectric is spaced from the contact vias formed in the interlayer dielectric.

BRIEF DESCRIPTION OF THE DRAWINGS

The disclosure may be understood by reference to the following description taken in conjunction with the accompanying drawings, in which like reference numerals identify like elements, and in which.

Figure 1A:
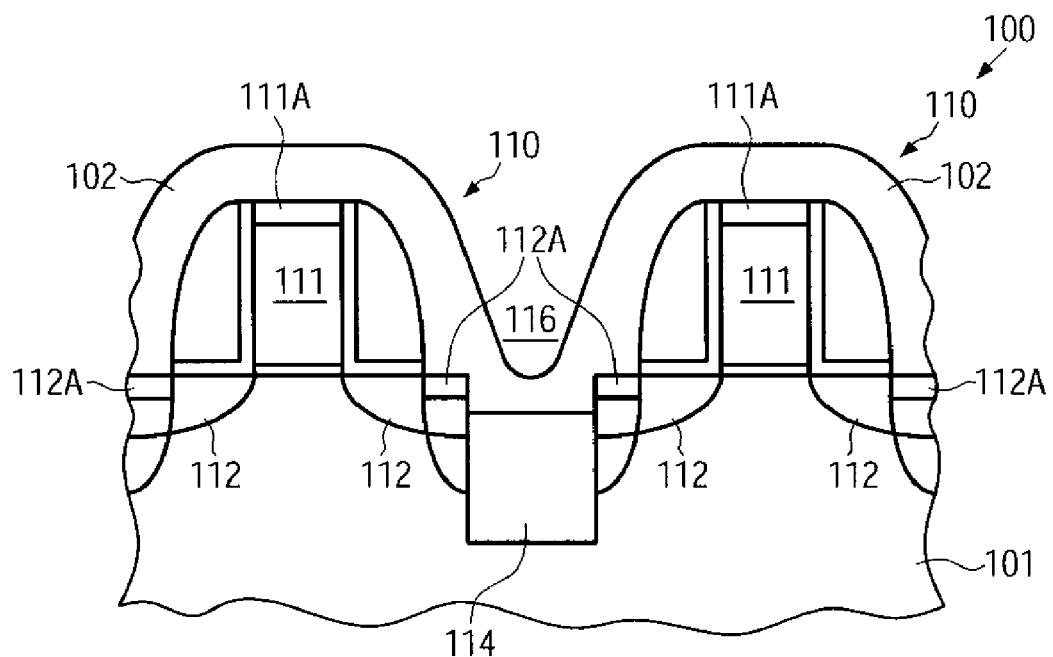
FIGS. 1A-1D schematically show cross-sectional views of a semiconductor device during the formation of a contact ILD and contact plugs on the basis of conventional technology.
Figure 1B:
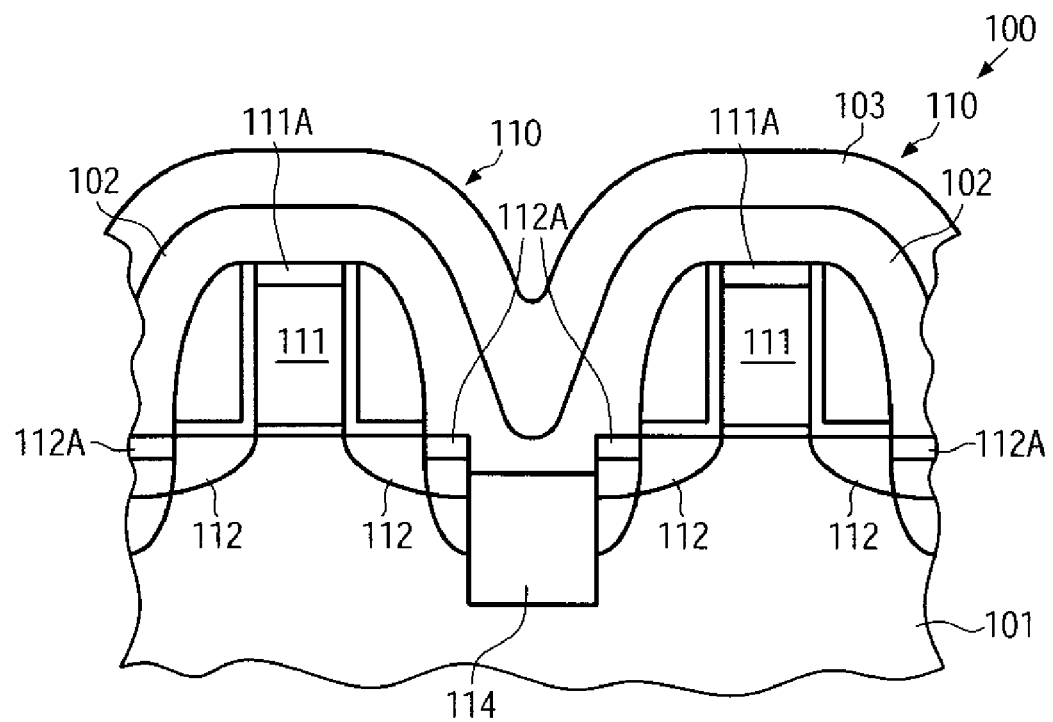
Figure 1C:
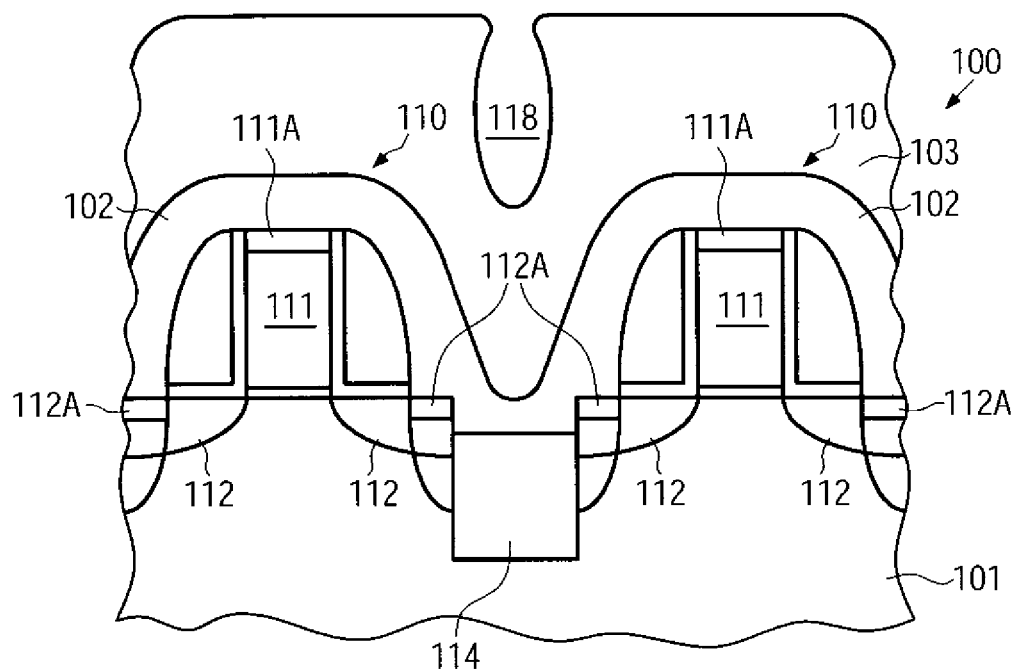
Figure 1D:
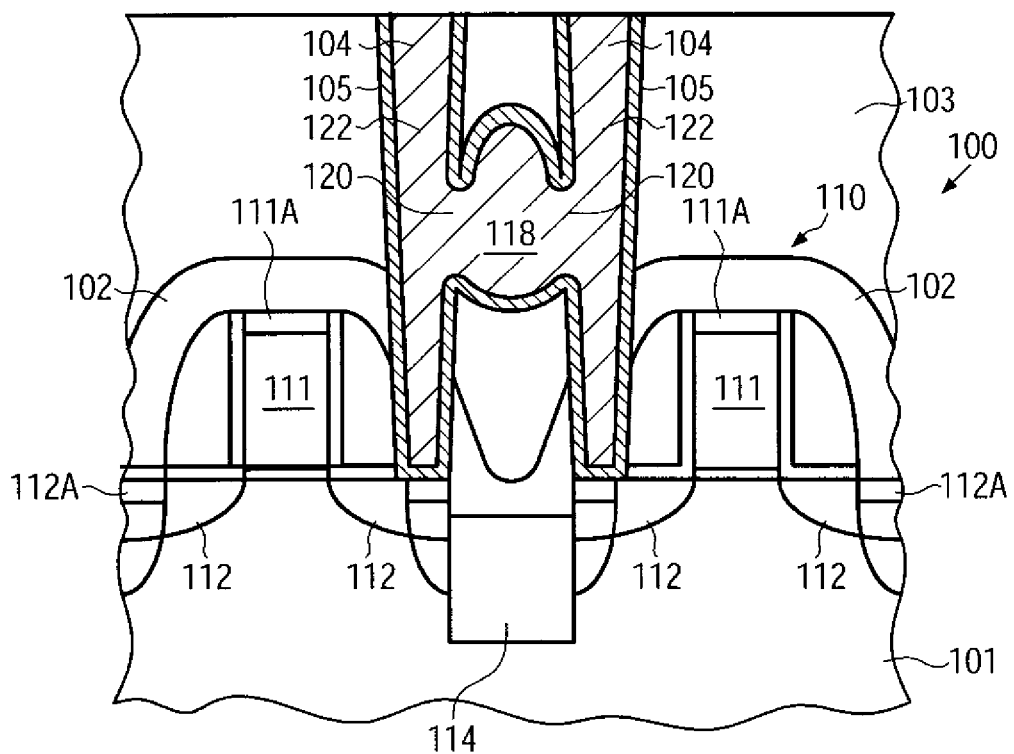

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to an enhanced technique for preventing the formation of electrical shorts between contact plugs connecting to respective contact regions of circuit elements, such as transistors, capacitors and the like. For this purpose, a recess is formed between two neighboring circuit elements, for example between two neighboring contact regions of neighboring circuit elements, thereby lowering the location of a void which is formed due to the short distance between two neighboring circuit elements during the deposition of a contact interlayer dielectric. In some illustrative embodiments, the recess is formed by removing material from a trench isolation between two neighboring elements. According to further illustrative embodiments, the trench isolation may be a shallow trench isolation. Lowering the location of the void in the contact ILD reduces the probability of the void being opened during the formation of contact vias, which in turn leads to a reduced probability of an electrical short between two neighboring contact vias of two neighboring circuit elements. The technique disclosed herein may readily be extended to the fabrication of contact structures of even highly scaled semiconductor devices, which may have critical dimensions of 100 nm and even significantly less, e.g., 65 nm and less.

Lowering the position of the void formed in the contact ILD with respect to contact regions of the respective circuit elements simplifies manufacturing, since the formation of vias and hence the formation of contact plugs is less critical. Further, lowering the position of the void formed in the contact ILD increases the yield so that the cost of manufacturing is reduced. By allowing even closer positioning of neighboring circuit elements, the operating speed of the semiconductor device may be increased. Further, the subject matter disclosed herein offers the potential to improve accuracy and precision of contact formation. Further, the subject matter disclosed herein offers the potential to improve reliability and/or efficiency of the semiconductor device.

Figure 2A:
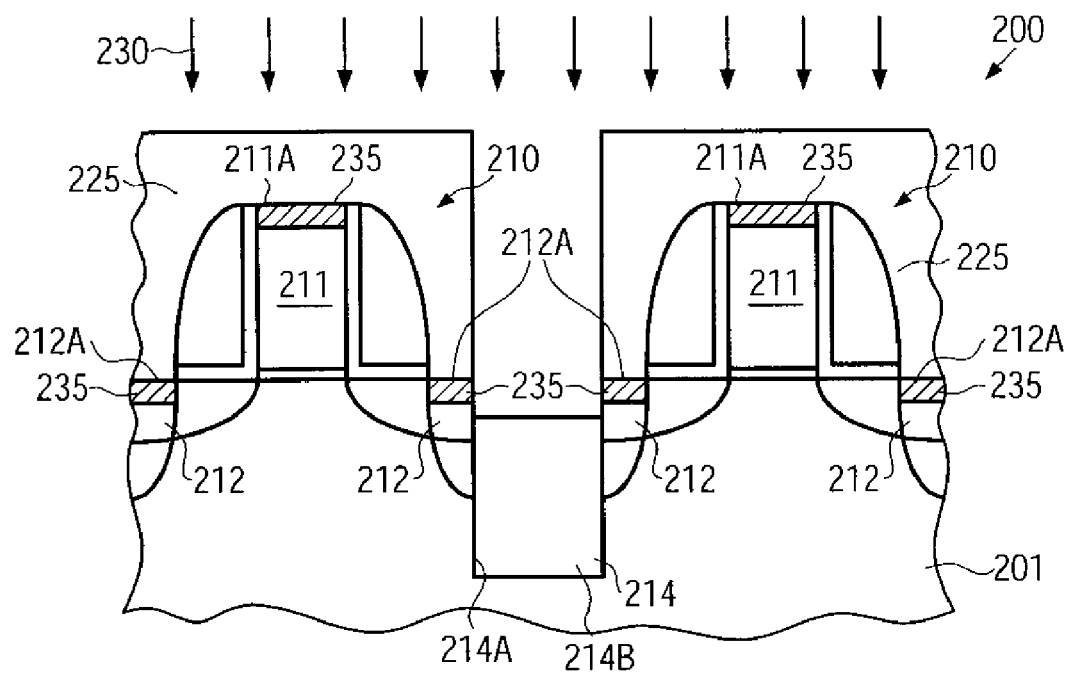
FIGS. 2A-2E schematically show cross-sectional views of a semiconductor device during the formation of a contact ILD and contact plugs in various manufacturing stages.

FIG. 2A schematically shows a semiconductor device 200 that comprises two circuit elements 210, such as capacitors, resistors or any other circuit element. In one illustrative embodiment, each circuit element 210 may be represented by a transistor element that is formed above a substrate 201. The substrate 201 may represent any appropriate substrate for forming semiconductor devices thereon, such as a silicon-on-insulator (SOI) substrate, a bulk semiconductor substrate or any other appropriate carrier having formed thereon a suitable semiconductor layer for forming circuit devices thereon and therein.

The semiconductor device 200 as shown in FIG. 2A may be formed in accordance with well-established techniques for forming circuit elements, such as the circuit elements 210, on the basis of any appropriate crystalline, polycrystalline and amorphous semiconductor materials. In illustrative embodiments, the circuit elements 210 may represent a highly advanced silicon-based semiconductor device, wherein minimum critical dimensions, such as a gate length, i.e., in FIG. 2A, the horizontal dimension of the gate electrode 211, may be 90 nm and less or even 50 nm and less for highly advanced devices. In some illustrative embodiments, the formation of the circuit elements 210 may comprise advanced silicidation processes for providing contact regions. The circuit elements 210 may comprise one or more contact regions 211A, 212A, which, in the example shown, are represented by respective metal silicide portions 235 of a gate electrode 211 and source and drain regions 212. In other embodiments, the contact regions 211A, 212A may be directly formed by the gate electrode 211 and the source and drain regions 212, respectively, omitting the silicide regions 235. According to an illustrated embodiment, the silicide 235 is a highly conductive metal silicide, e.g., a nickel silicide, which is formed by a chemical reaction between a deposited nickel layer and the underlying silicon-containing material. In this way, a significant amount of nickel monosilicide is created while substantially avoiding the formation of the less conductive nickel disilicide. During the formation of the respective nickel silicide regions, a heat treatment may be performed so as to initiate the respective chemical reaction and to stabilize the corresponding phase of nickel silicide. For example, in any subsequent process steps, a certain temperature should not be exceeded, such as approximately 400° C., so as to not unduly convert further nickel monosilicide into unwanted nickel disilicide.

The semiconductor device 200 further comprises a shallow trench isolation 214. The trench isolation 214 may be formed according to well-known recipes and methods, e.g., by etching a trench 214A into the semiconductor layer 201 and subsequently filling the trench 214A with an appropriate insulating material 214B, such as silicon dioxide. After filling the insulating material 214B into the trench 214A, the surface of the resulting structure is usually planarized, e.g., by chemical mechanical polishing (CMP). On the resulting structure, having the trench isolation 214 therein, the circuit elements 210 are formed using well known techniques and recipes.

Figure 2B:
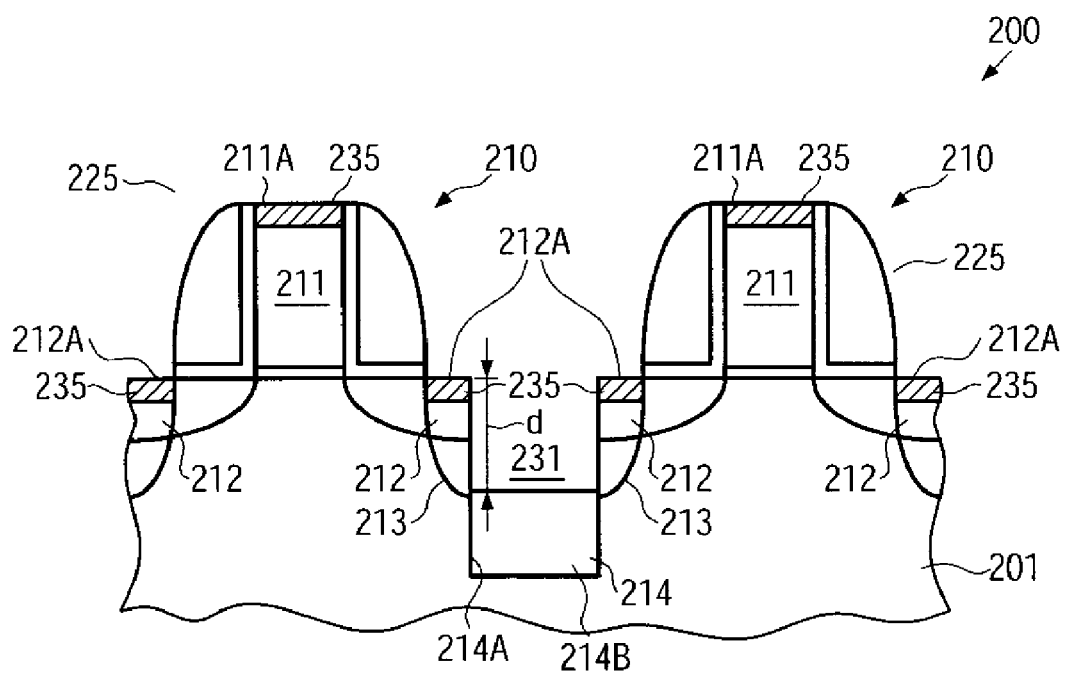

After completing the formation of the circuit elements 210, the circuit elements are usually covered with an etch stop layer and a contact interlayer dielectric. However, according to one embodiment, as illustrated in FIG. 2A, after formation of the silicide in the contact regions 212A, 211A, the circuit elements 210 are covered with an appropriate masking layer 225 which is subsequently structured to expose the isolation trench 214. The deposition and structuring of the masking layer 225 is performed according to well-established processes and recipes. It should be noted that the isolation trench 214 may already be recessed with respect to the contact regions 212A of the source and drain regions of the transistors 210 due to previous etch or cleaning processes which might have removed some material 214B of the isolation trench 214 from its surface. The trench isolation etch process 230 is performed using known techniques and recipes for the respective trench isolation material 214B, e.g., wet or dry etch techniques, and is performed in order to obtain a desired depth of the recess 231 (FIG. 2B). In FIG. 2B, the masking layer 225 has been removed using well-established processes and recipes.

In the embodiment shown in FIG. 2B, the recess 231 extends down to a depth "d" which may, in some cases, correspond approximately to a depth of a dopant profile of the source and drain regions 212. According to other embodiments, the recess 231 extends down to a depth "d" which is below the dopant profile 213 of the source and drain regions 212. In still other embodiments, the recess 231 extends down to a depth "d" which is within the dopant profile 230. It should be further noted that, according to illustrative embodiments, the recess 231 is formed essentially perpendicular to a gate length of the transistors 210 shown in FIGS. 2A-2E.

Figure 2C:
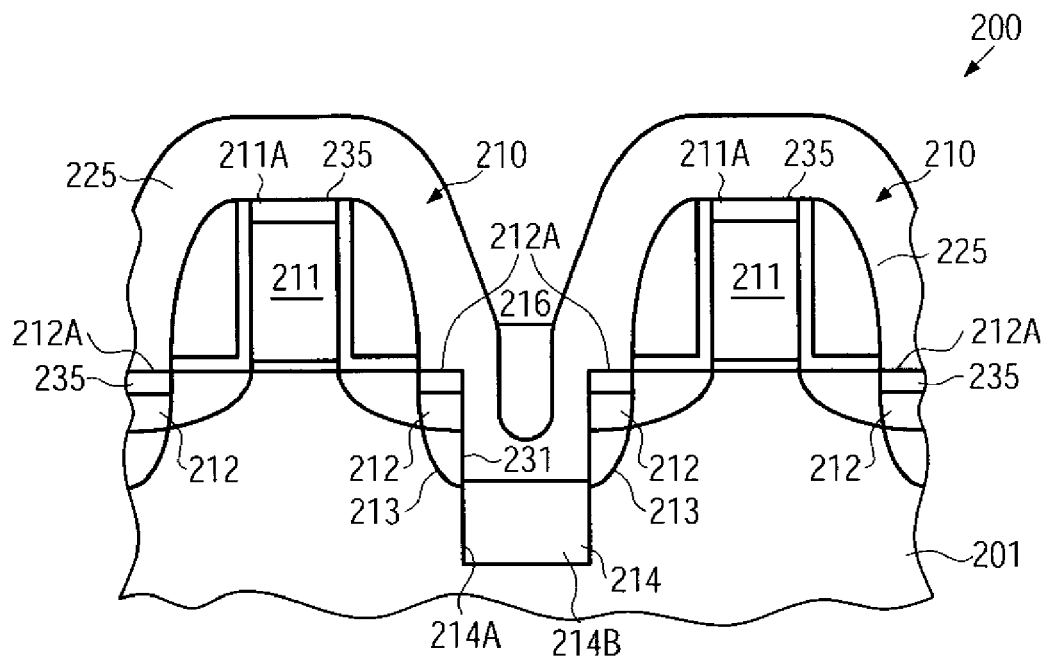

FIG. 2c shows the semiconductor device 200 in a further advanced manufacturing stage in which a contact etch stop layer 202 has been deposited on the basis of well-established techniques, typically involving a CVD technique with or without a plasma assisted deposition atmosphere. The contact etch stop layer further increases the aspect ratio of the gap 216 between the gate structures including the gate electrodes 211 and spacers 232. The inventors have found that it is usually not possible to avoid the formation of gap voids between dense gate electrodes and adversely shaped spacer profiles.

Figure 2D:
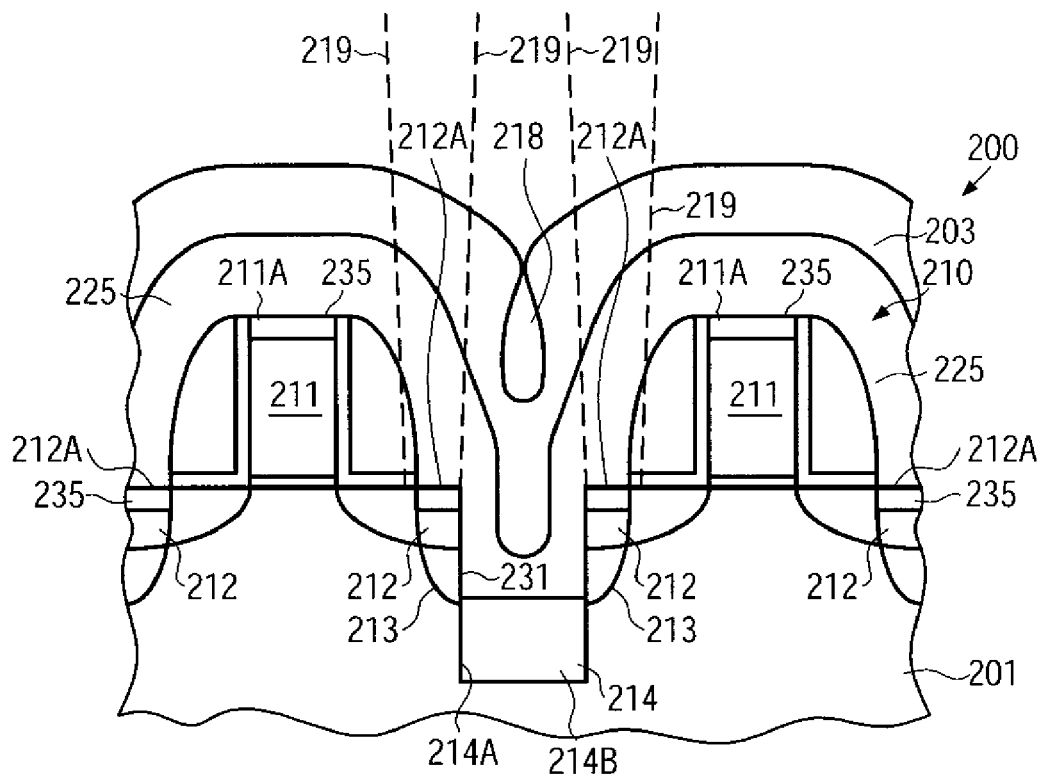

FIG. 2D shows the semiconductor device 200 in a manufacturing stage during deposition of the interlayer dielectric 203 wherein the formation of the void 218 has been completed. The contact ILD 203 may be formed according to well-established techniques, e.g., CVD techniques. The material of the contact ILD may be silicon dioxide or may be based on silicon dioxide. The silicon dioxide may be formed on the basis of TEOS, thereby providing a dense and compact material layer. Although the formation of a void was not avoided in FIG. 2D, due to the recess 231, the formation of a void 218 in the interlayer dielectric material 203 takes place deeper with respect to the neighboring contact portions 212A compared to a void which would have been formed without the recess 231. Due to the deeper formation of the void, via paths (indicated by dotted lines 219 in FIG. 2D) along which contact vias are formed for contacting the contact regions 212A through the interlayer dielectric material 203, and which extend upwards from the neighboring contact portions 212A, are spaced from the void 218. It should be noted that the depth "d" of the recess 231 is adapted to the technology used. For example, in order to determine the appropriate depth "d" of the recess 231, a sequence of devices 200 may be fabricated with different depths "d" of the recesses 231 and respective pictures of cross-sections of the devices 200 may be taken in order to determine an optimum for the depth "d" for the current geometry of the neighboring circuit elements 210, the layer thicknesses, the deposition parameters, etc.

Figure 2E:
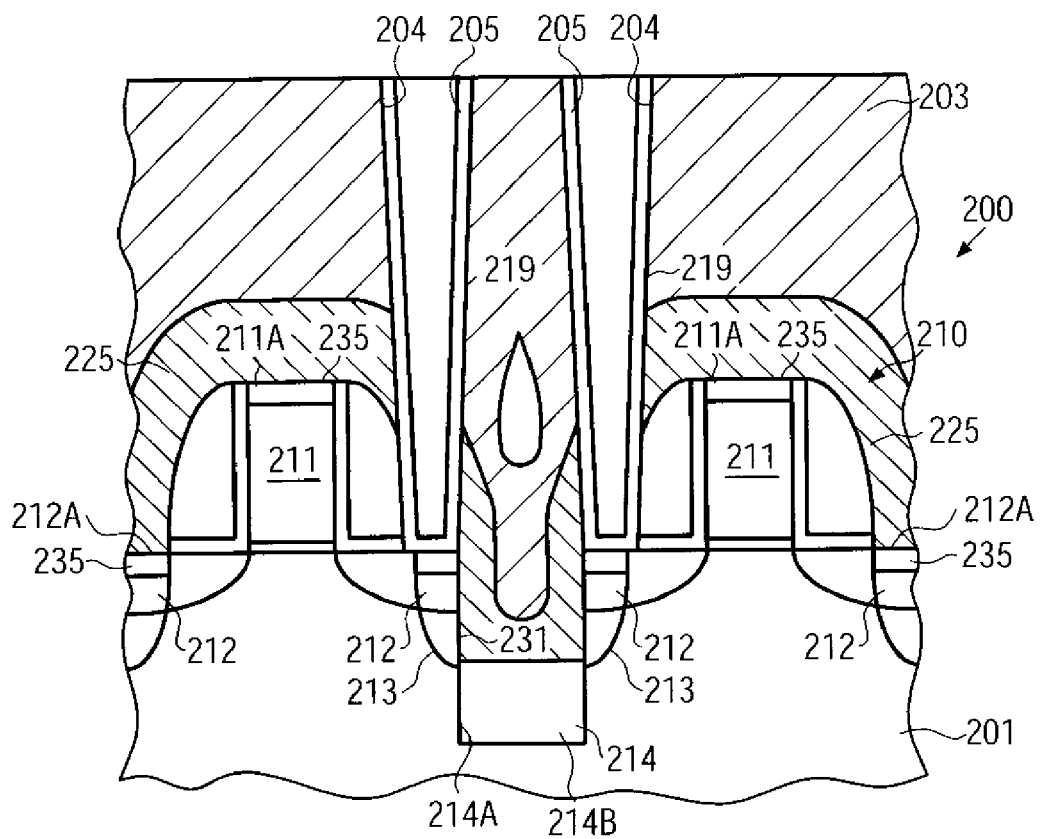

FIG. 2E shows the semiconductor device 200 in a further advanced manufacturing stage wherein the interlayer dielectric 203 has been deposited to its final thickness. After formation of the interlayer dielectric layer 203, the surface thereof may be planarized with an appropriate technique, for example, chemical mechanical polishing (CMP). According to other illustrative embodiments, a planarization step is omitted. After completing the interlayer dielectric layer 203, contact holes 204 may be formed by photolithography and advanced etch techniques wherein, depending on the design requirements, a width of the openings 204 may be of the same order of magnitude as the corresponding critical dimensions, i.e., the respective gate length of the circuit elements 210. After formation of the contact openings, the device 200 may be exposed to the ambient of a pre-treatment so as to remove any etch byproducts that may have formed on the exposed portions of the contact regions 211 and 212. Thereafter, a barrier layer 205 may be formed on the bottom and the sidewalls of the contact openings 204. The barrier layer 205 may comprise a single layer or two or more layers. For example, the barrier layer 205 may comprise a titanium liner and a titanium nitride layer in a tungsten contact technology shown in FIG. 2E. The deposition of the barrier layer may be performed by well-established techniques, such as a sputter process. Subsequently, the contact hole is filled with a tungsten-based material, for example, using a CVD process. According to other illustrative embodiments, other contact techniques may be used, for example, copper plugs instead of tungsten plugs may be used with an appropriate barrier material, such as tantalum and/or tantalum nitride. As illustrated in FIG. 2E, the void 218 is located relatively deep with regard to the neighboring contact regions 212A of the neighboring circuit devices 210. Consequently, the void 218 does not interfere with the contact holes 204 and hence the void 218 is not opened by forming the contact holes 204. Hence the void 218, although present in the semiconductor device 200, does not give rise to the formation of an electrical short between neighboring contact regions 212A of neighboring circuit devices 210.

Figure 3A:
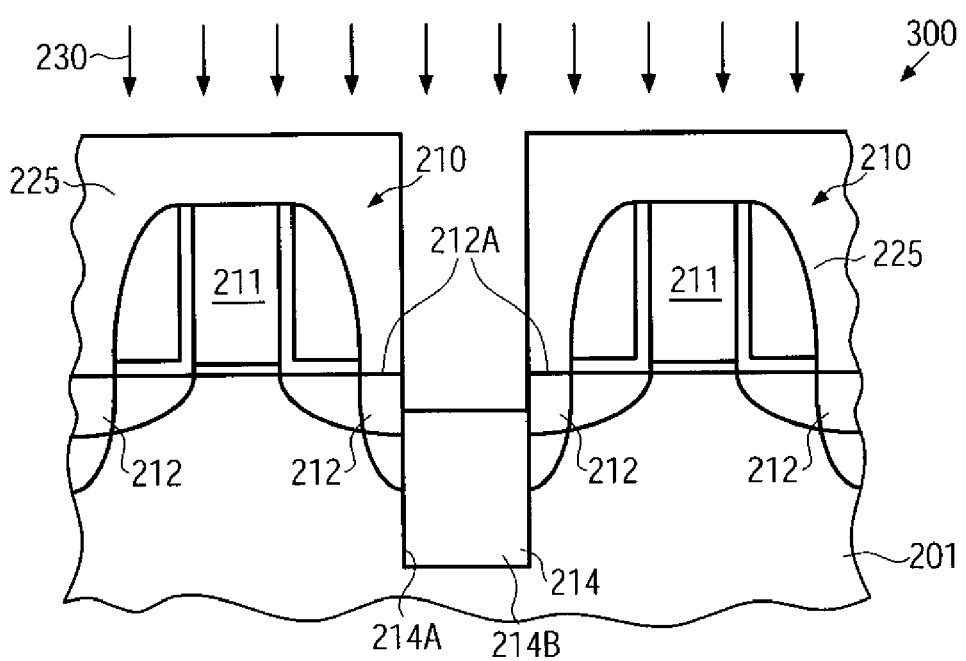
FIGS. 3A-3C schematically show cross-sectional views of a semiconductor device during recessing of a shallow trench isolation in various manufacturing stages.
Figure 3B:
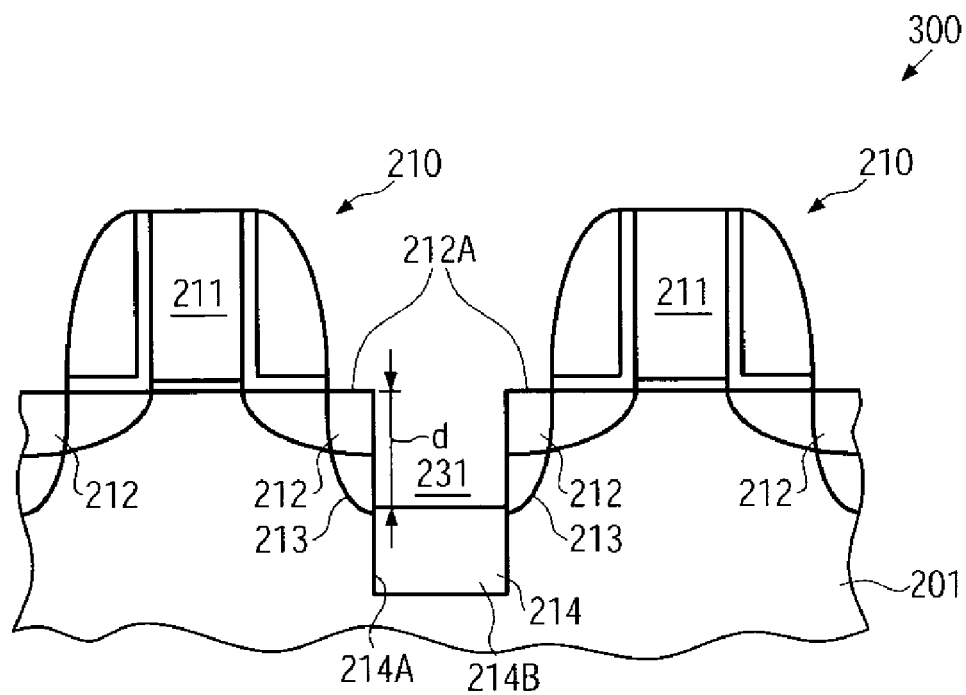
Figure 3C:
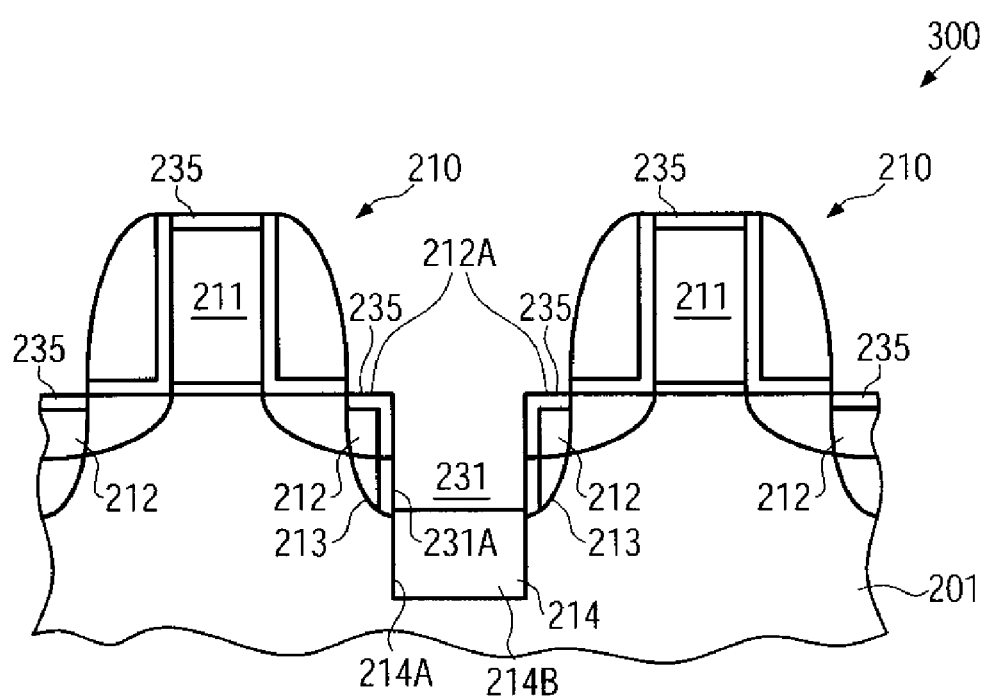

FIGS. 3A-3C illustrate another embodiment of a manufacturing process of a semiconductor device 300. The manufacturing stage illustrated in FIG. 3A is similar to the manufacturing stage of the semiconductor device 200 illustrated in FIG. 2A, the details of which are not repeated here. The semiconductor device 300 in FIG. 3A differs from the semiconductor device 200 in FIG. 2A in that no silicide has been formed in the contact regions 211A, 212A before the circuit elements 210 are covered with the masking layer 225. Similar to the process illustrated in FIG. 2A, an etch process 230 is performed on the semiconductor device 300 illustrated in FIG. 3A in order to remove material from the trench isolation 214.

FIG. 3B illustrates the semiconductor device 300 of FIG. 3A with the masking layer 225 removed and the trench isolation 214 etched down to a predetermined depth "d" with respect to neighboring contact regions 212A of neighboring circuit devices 210, thereby forming a recess 231 above the trench isolation 214.

FIG. 3C shows the semiconductor device 300 in a further advanced manufacturing stage wherein a metal silicide 235 has been formed in the neighboring contact regions 212A of neighboring circuit elements 210. The silicide 235 may be formed as described with regard to FIG. 2A.

Since the recess 231 above the trench isolation 214 has been formed before forming the contact silicide 235 of the circuit elements 210, the contact silicide 235 is also formed on the sidewalls 231A of the recess 231. In this way, since the area of the contact silicide 235 is increased, the overall resistance of the circuit element 210 may be reduced. This may be advantageous for device speed and power consumption of the semiconductor device 300. After the manufacturing stage illustrated in FIG. 3C, the steps illustrated in FIGS. 2C-2E may be performed on the semiconductor device 300 illustrated in FIG. 3C.

Figure 4A:
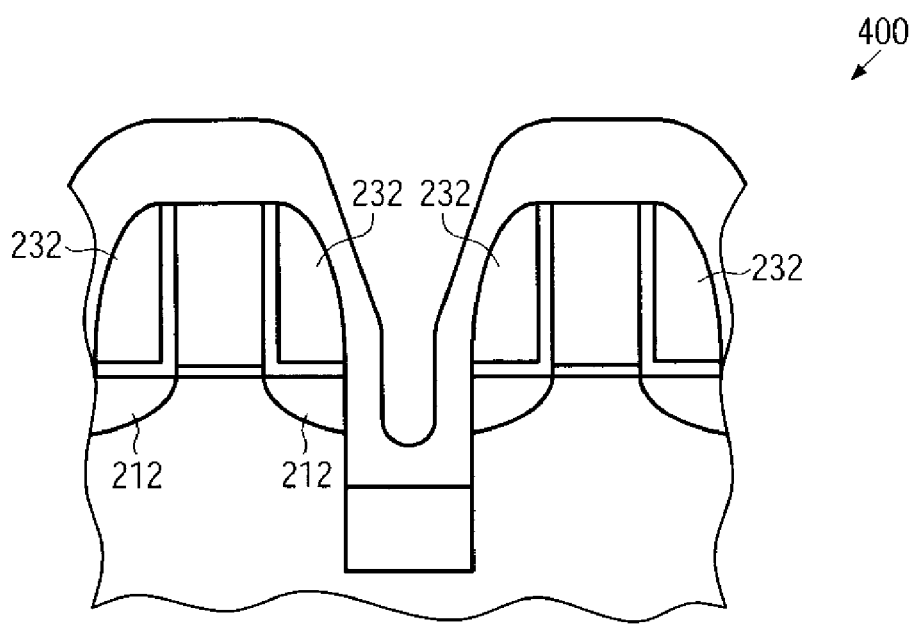
FIGS. 4A-4B schematically show cross-sectional views of a semiconductor device during the formation of a contact ILD and contact plugs in two manufacturing stages.
Figure 4B:
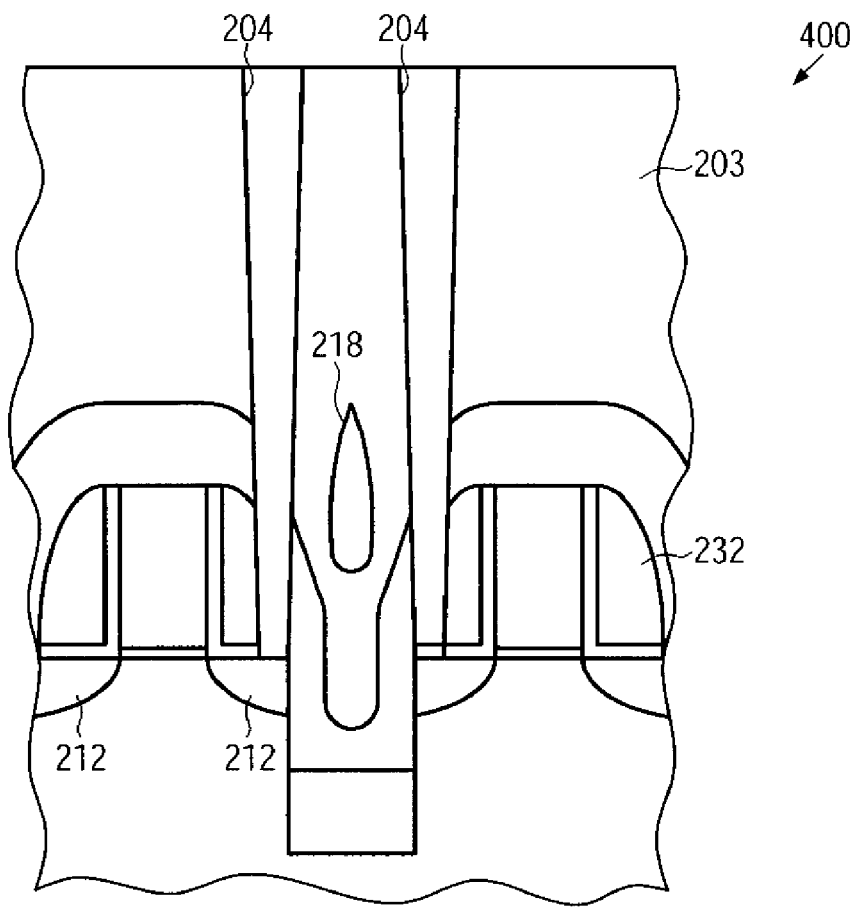

The subject matter disclosed herein provides the potential to further reduce the distance between two neighboring circuit elements 210, e.g., the distance between two neighboring gates 211, as exemplarily illustrated in FIG. 4A. The transistors of FIG. 4A do not comprise a contact region besides the sidewall spacers 232. Rather, in order to electrically contact the source and drain regions 212 of the circuit elements 210 of the semiconductor device 400, contact holes 204 are etched through the sidewall spacers 232 to the source/drain regions 212. Although this results in very close contact holes 204, due to the formation of the void 218 in the interlayer dielectric 203 at a very low level in accordance with illustrated embodiments disclosed herein, an electrical short does not occur even in the extremely dense packed semiconductor device 400 illustrated in FIGS. 4A and 4B. In FIG. 4B, at least part of the void 218 is located vertically at the same level as the circuit elements.

Figure 5:
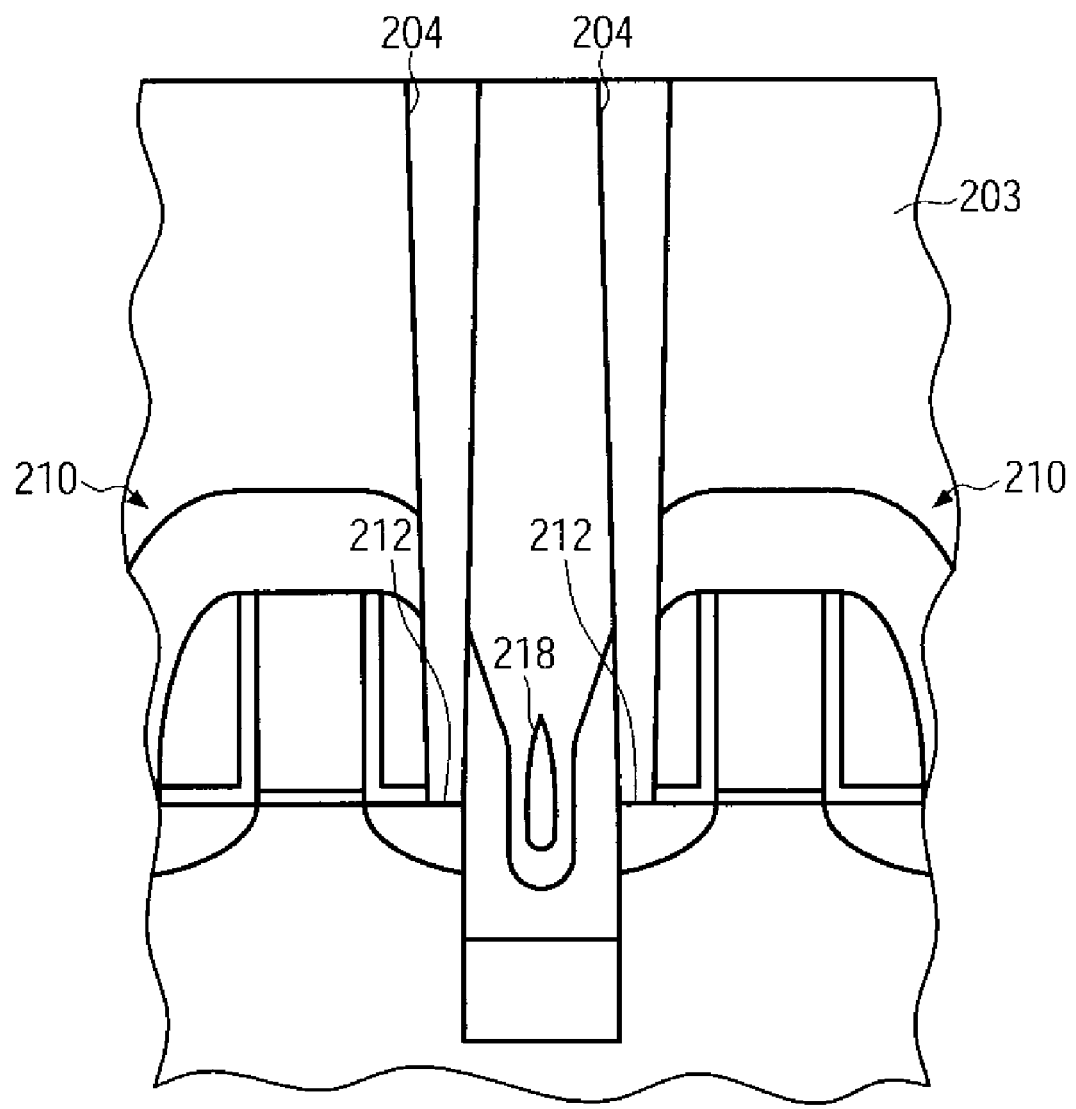
FIG. 5 schematically shows a cross-sectional view of a semiconductor device described herein.

According to another embodiment shown in FIG. 5, the geometry and the process conditions for the formation of the interlayer dielectric 203 are chosen such that the void 218 forms at least in part vertically below the neighboring contact regions 212A of neighboring circuit elements 210. This embodiment provides a very safe and reliable formation of contact holes 204 in the interlayer dielectric 203 without danger of the formation of an electrical short between the neighboring contact regions 212 of the neighboring circuit elements 210.

As a result, the present subject matter provides an enhanced technique that enables the formation of semiconductor devices which have a reduced tendency to the formation of an electrical short between neighboring contact regions of neighboring circuit elements. It was found to be difficult to avoid the formation of gap voids between densely spaced circuit elements, in particular between densely spaced polygates with adversely shaped spacer profiles. However, by employing the principles disclosed herein, it is possible to prevent opening the gap void with a contact hole. The void has to be buried very deep in the interlayer dielectric 203, even in the trench of a trench isolation in some illustrated embodiments. According to some illustrated embodiments, the gap void is buried very deep, close to the recessed STI. According to one embodiment, after the formation of a contact silicide, the STI in the critical regions is removed by a wet or a dry etch process. Therefore, the level at which the void formation takes place is much deeper and the void cannot be opened by a contact hole. According to another embodiment, the removal of the STI in the critical regions is performed before the formation of the silicide. This leads to the formation of contact silicide on the sidewalls of the recess above the STI and hence to a good electrical contact and low resistivity of the contact regions of the circuit element. Thereby, the subject matter disclosed herein provides for a high aspect ratio of the gap between neighboring circuit elements and hence offers potential to further improvement of semiconductor devices in terms of operating speed, reliability and efficiency. Further, manufacturing is simplified and the cost thereof is reduced. Further, accuracy and/or precision of the semiconductor device is improved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
providing a semiconductor device having at least two circuit elements, said circuit elements having contact regions; and
forming a recess between two neighboring circuit elements by removing part of a trench isolation located between said neighboring circuit elements, said recess having a predetermined depth with respect to a contact region of said circuit elements such that, in a subsequently formed interlayer dielectric, a void is formed spaced from via paths along which contact vias are formed for contacting said contact regions of said circuit elements through said interlayer dielectric material.

2. The method of claim 1, wherein said recess is formed by selectively etching said trench isolation to said predetermined depth.

3. The method of claim 2, further comprising forming a mask over the neighboring circuit elements before selectively etching said trench isolation, the mask exposing only a region to be selectively etched.

4. The method of claim 1, further comprising forming said recess after forming a contact silicide of said circuit elements.

5. The method of claim 1, further comprising forming said recess before forming a contact silicide of said circuit elements.

6. The method of claim 1, further comprising:
forming an etch stop layer above said circuit elements and in said recess; and
filling a space above said recess with a dielectric material.

7. The method of claim 1, wherein said circuit elements are transistors and said recess is formed essentially perpendicular to a gate length of said transistors.

8. A method, comprising:
selectively etching insulating material used to fill a trench of a trench isolation which is located between two circuit elements such that, in a subsequently formed interlayer dielectric, a void is formed spaced from via paths along which contact vias are formed for contacting contact regions of said circuit elements through said interlayer dielectric material.

9. The method of claim 8, further comprising selectively etching said insulating material while said two circuit elements are covered with an etch mask.

10. The method of claim 8, further comprising:
forming said trench isolation by etching the trench into a semiconductor layer and filling at least a portion of the trench with said insulating material; and
forming at least in part two circuit elements in and/or above said semiconductor layer on opposite sides of said trench isolation prior to selectively etching said trench isolation.

11. A method, comprising:
selectively etching a trench isolation which is located between two circuit elements such that, in a subsequently formed interlayer dielectric, a void is formed spaced from via paths along which contact vias are formed for contacting contact regions of said circuit elements through said interlayer dielectric material, wherein said circuit elements are transistors.

12. The method of claim 11, wherein said transistors have contact regions for electrically contacting said transistors and wherein said trench isolation is selectively etched to a depth below the contact regions.

* * * * *